United States Patent [19]
Takeuchi et al.

[11] Patent Number: 5,398,481
[45] Date of Patent: Mar. 21, 1995

[54] VACUUM PROCESSING SYSTEM

[75] Inventors: Noriyuki Takeuchi; Masaaki Kajiyama; Fumio Kondo; Masao Matsumura; Takeshi Yoshioka, all of Fujisawa, Japan

[73] Assignee: Ebara Corporation, Tokyo, Japan

[21] Appl. No.: 62,853

[22] Filed: May 18, 1993

[30] Foreign Application Priority Data

| May 19, 1992 [JP] | Japan | 4-151389 |
| Oct. 5, 1992 [JP] | Japan | 4-290817 |
| Nov. 12, 1992 [JP] | Japan | 4-327220 |

[51] Int. Cl.⁶ ............ H01L 21/00; B65B 49/05
[52] U.S. Cl. ............ 53/432; 53/90; 53/405; 53/510
[58] Field of Search ........... 53/432, 405, 403, 408, 53/89, 90, 86, 79, 510; 156/643; 414/786

[56] References Cited

U.S. PATENT DOCUMENTS

| 4,687,542 | 8/1987 | Davis et al. | 156/643 |
| 4,816,116 | 3/1989 | Davis et al. | 156/643 |
| 4,842,680 | 6/1989 | Davis et al. | 156/643 |
| 4,943,457 | 7/1990 | Davis et al. | 428/35.2 |
| 4,966,519 | 10/1990 | Davis et al. | 414/786 |
| 4,987,726 | 1/1991 | Pethö et al. | 53/90 X |
| 5,044,871 | 9/1991 | Davis et al. | 414/786 |
| 5,137,063 | 8/1992 | Foster et al. | 141/98 |
| 5,239,806 | 8/1993 | Maslakow | 53/432 |

FOREIGN PATENT DOCUMENTS

| 0219826 | 4/1987 | European Pat. Off. |
| 0313693 | 5/1989 | European Pat. Off. |

OTHER PUBLICATIONS

European Search Report, dated Aug. 24, 1993.

*Primary Examiner*—James F. Coan
*Attorney, Agent, or Firm*—Armstrong, Westerman, Hattori, McLeland & Naughton

[57] ABSTRACT

Several vacuum process steps are applied to substrates such as a wafer using a vacuum container for storing and transporting the substrates under vacuum. The vacuum container comprises a container body having a main opening for inserting a substrate and taking out the substrate, a lid engageable with the container body for closing and sealing the main opening of the container body, and a gate provided on one of the container body and the lid for performing at least one of evacuating an interior of the vacuum container and raising the pressure of the interior of the vacuum container to ambient.

13 Claims, 8 Drawing Sheets

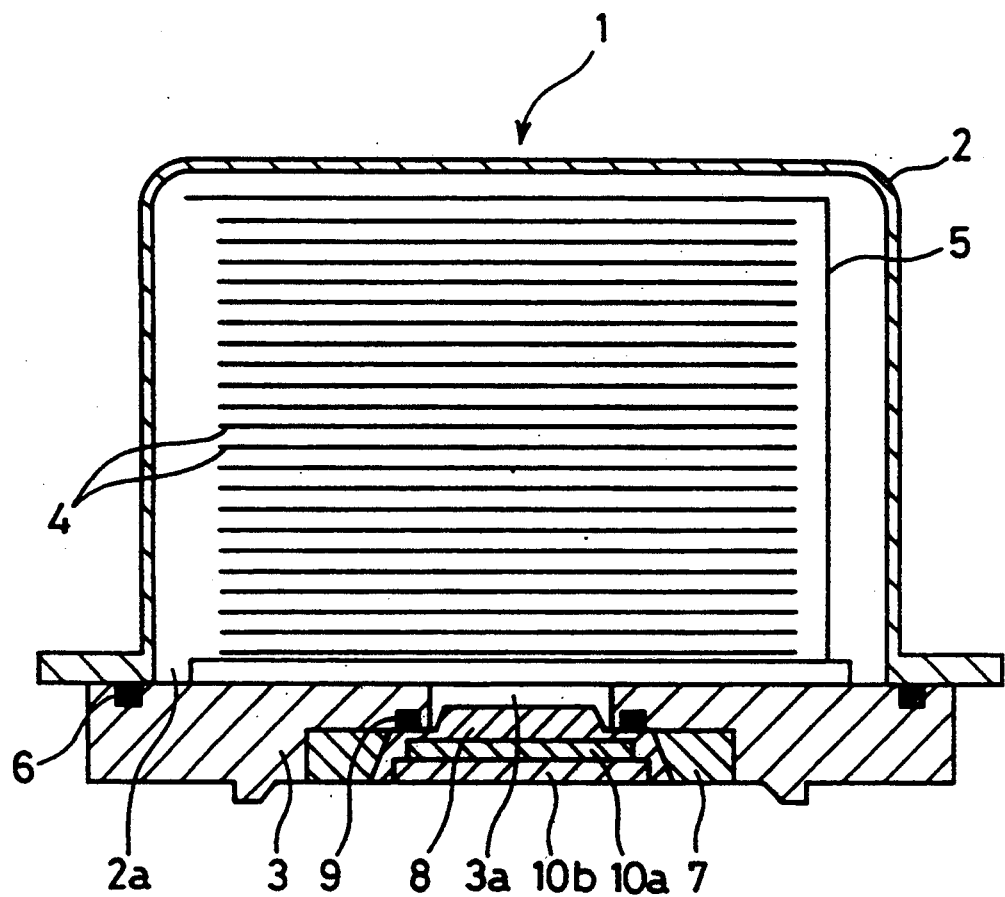
F I G. 1

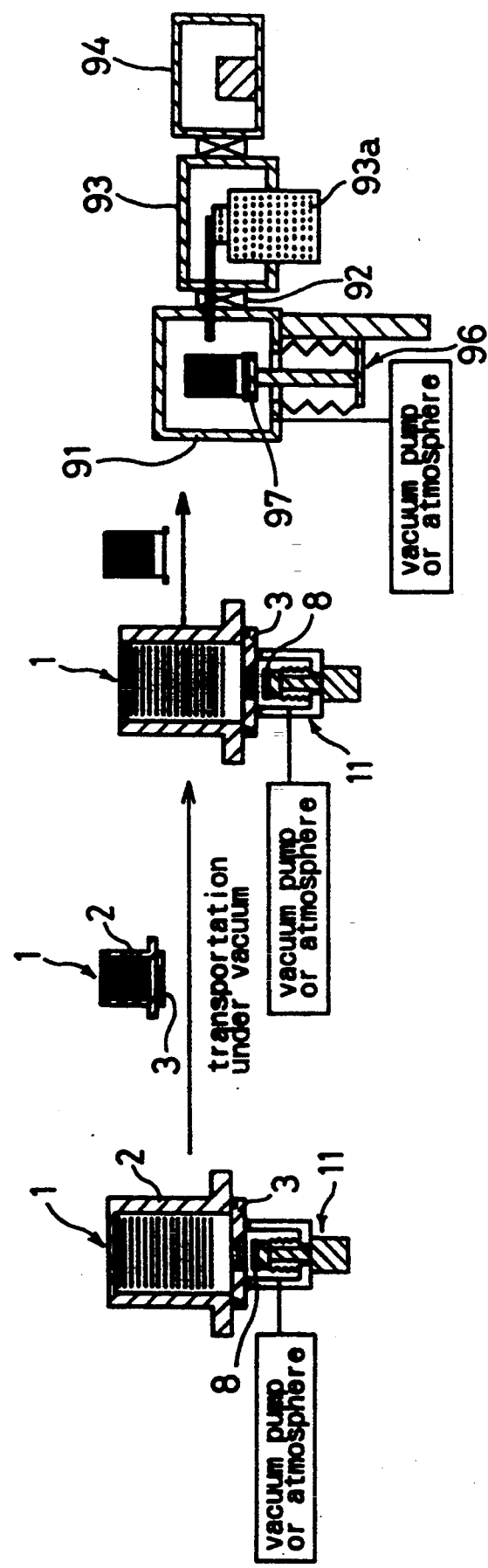

VACUUM PROCESSING SYSTEM

BACKGROUND OF THE INVENTION

1. Field of the Invention

The present invention relates to a vacuum processing system, and more particularly to a vacuum processing system where several vacuum process steps are applied to substrates such as wafers by the use of a vacuum container for storing and transporting the substrates under vacuum.

2. Description of the Prior Art

In integrated-circuit manufacturing, to prevent oxidation of wafers, there has been known a vacuum processing system which employs a vacuum container for transporting the wafers from a process station to a next process station, or storing the wafers during waiting process steps at a process station. One conventional vacuum container called a vacuum carrier is disclosed in Japanese Laid-Open patent publication 62-181441. The vacuum carrier comprises a carrier body and a carrier cover which connect each other with air-tight seal by differential pressure. The carrier body has a plurality of slits in which the wafers are placed.

The carrier body and the carrier cover are held closed by differential pressure through a vacuum seal such as an O-ring interposed between the carrier body and the carrier cover, whereby the interior of the vacuum carrier is held in vacuum.

In order to place the wafers into the vacuum carrier, first the vacuum carrier is placed in an upper load lock, then a lid of the upper load lock is closed, and the interior of the upper load lock is evacuated by a vacuum pump. Thereafter only the carrier body is lowered into a lower load lock in vacuum by lowering a stage connected to an elevator while the carrier cover remains in the upper load lock, and the wafers are transferred from a vacuum process chamber to the carrier body by a transferring device such as a robot. After transfer of the wafers into the carrier body, the carrier body is raised and joined to the carrier cover. After the pressure in the upper load lock is raised to ambient, the vacuum carrier is separated from the upper load lock and transported to a next process station.

In order to transfer the wafers in the vacuum carrier to the next process station, first the vacuum carrier is placed in the upper load lock, then the lid of the upper load lock is closed, and the interior of the upper load lock is evacuated by the vacuum pump. Only the carrier body is then lowered into the lower load lock by lowering the stage while the carrier cover remains in the upper load lock. Thereafter, the wafers are transferred from the carrier body to the vacuum process chamber by the transferring device.

By repeating the above steps, the wafers are transported from a process station to a next process station while the wafers are kept under vacuum.

However in the conventional vacuum processing system, the transportable vacuum carrier is not provided with a vacuum pump, the pressure in the vacuum carrier is raised with the lapse of time due to gas desorption from the inner surface of the vacuum carrier or leakage of air entering the vacuum carrier through the vacuum seal.

When the wafers are transported from a process station to a next process station, the wafers cannot always be transferred immediately after the transportation because the process station is occupied by preceding wafers. Thus the wafers must be waiting for the process. During waiting, the pressure in the vacuum carrier is raised, and native oxide is thus generated on the wafers in the vacuum carrier.

SUMMARY OF THE INVENTION

It is therefore an object of the present invention to provide a vacuum container whose interior can be evacuated through a vacuum-sealable gate to hold the pressure thereof in vacuum to store substrates, such as wafers, with easy operation, thereby preventing the substrates from deterioration caused by oxidation (in case of a wafer, generation of native oxide on the wafer).

Another object of the present invention is to provide a vacuum processing apparatus and method which can store the substrates under vacuum using the vacuum container, can transport the substrates among process stations under vacuum, and can transfer the substrates from the vacuum container to the process station under vacuum.

Another object of the present invention is to provide a vacuum processing apparatus and method which can store substrates under vacuum using the vacuum container, can transport the substrates among process stations under vacuum, and can transfer the substrates from the vacuum container to the process station after raising the pressure of the interior of the vacuum container to ambient by venting through the gate.

According to one aspect of the present invention, there is provided a vacuum container comprising: a container body having a main opening for placing substrates and taking out the substrates; a lid engageable with the container body for closing and sealing the main opening of the container body; and a gate provided on one of the container body and the lid for performing at least one of evacuating an interior of the vacuum container and raising the pressure of the interior of the vacuum container to ambient.

With the above vacuum container structure, the interior of the vacuum container can be evacuated through the gate provided on the vacuum container. Therefore, the substrates are prevented from deterioration such as oxidation, because the pressure in the vacuum container is held in vacuum while the wafers are stored in the vacuum container.

According to another aspect of the present invention, there is provided a vacuum processing method comprising the steps of: placing a plurality of substrates in a vacuum container, the vacuum container having a vacuum sealable lid and a vacuum sealable gate; storing the substrates in the vacuum container under vacuum with evacuating the interior of the vacuum container through the gate; transporting the substrates under vacuum without pressure rise in the vacuum container to a vacuum process station after closing the gate; connecting the vacuum container to a load lock of the vacuum process station and transferring the substrates from the vacuum container to the load lock under vacuum after opening the lid of the vacuum container.

With the above method, the substrates are stored under vacuum without pressure rise in the vacuum container as the interior of the vacuum container is evacuated through the gate. After transporting the vacuum container to the vacuum process station, the substrates can be transferred to the load lock of the vacuum process station under vacuum.

According to another aspect of the present invention, there is provided a vacuum processing method comprising the steps of: placing a plurality of substrates in a vacuum container, the vacuum container having a vacuum sealable lid and a vacuum sealable gate; storing the substrates under vacuum without pressure rise in the vacuum container, as evacuating an interior of the vacuum container through the gate; raising the pressure of an interior of the vacuum container to ambient through the gate; and transferring the substrates into a load lock of a vacuum process station at ambient after taking out the substrates from the vacuum container.

With the above method, the substrates are stored in the vacuum container under vacuum as the interior of the vacuum container is evacuated through the gate. After the interior of the vacuum container is raised to ambient through the gate, the substrates are taken out of the vacuum container and transferred to the load lock of the vacuum process station.

According to another aspect of the present invention, there is provided a vacuum processing apparatus comprising: a vacuum container having a vacuum sealable lid and a vacuum sealable gate for containing a plurality of substrates; an evacuation and vacuum break station for evacuating an interior of the vacuum container and raising the pressure of the interior of the vacuum container to ambient through the gate; and a load lock connectable to the vacuum container, the substrates being transferred from the vacuum container into the load lock under vacuum, the load lock being communicated with a vacuum process chamber.

With the above apparatus, the substrates are stored in the vacuum container under vacuum as the interior of the vacuum container is evacuated by the evacuation and vacuum break station. After transporting the vacuum container to the vacuum process station, the substrates can be transferred to the load lock of the vacuum process station under vacuum.

According to another aspect of the present invention, there is provided a vacuum processing apparatus comprising: a vacuum container having a vacuum sealable lid and a vacuum sealable gate for containing a plurality of substrates; an evacuation and vacuum break station for evacuating an interior of the vacuum container and raising the pressure of the interior of the vacuum container to ambient through the gate; and a load lock connectable to the vacuum container, the substrates being transferred from the vacuum container into the load lock at ambient after raising the pressure of the interior of the vacuum container to ambient, the load lock being communicated with a vacuum process chamber.

With the above apparatus, the substrates are stored in the vacuum container under vacuum as the interior of the vacuum container is evacuated by the evacuation and vacuum break station. After the pressure of the interior of the vacuum container is raised to ambient, the substrates are taken out of the vacuum container and transferred to the load lock of the vacuum process station.

The above and other objects, features, and advantages of the present invention will become apparent from the following description when taken in conjunction with the accompanying drawings which illustrate preferred embodiments of the present invention by way of examples.

BRIEF DESCRIPTION OF THE DRAWINGS

FIG. 1 a cross-sectional view of a vacuum container according to an embodiment of the present invention;

FIG. 9 is a schematic view of a vacuum processing apparatus according to another embodiment of the present invention.

DETAILED DESCRIPTION OF THE PREFERRED EMBODIMENTS

Figure 2:
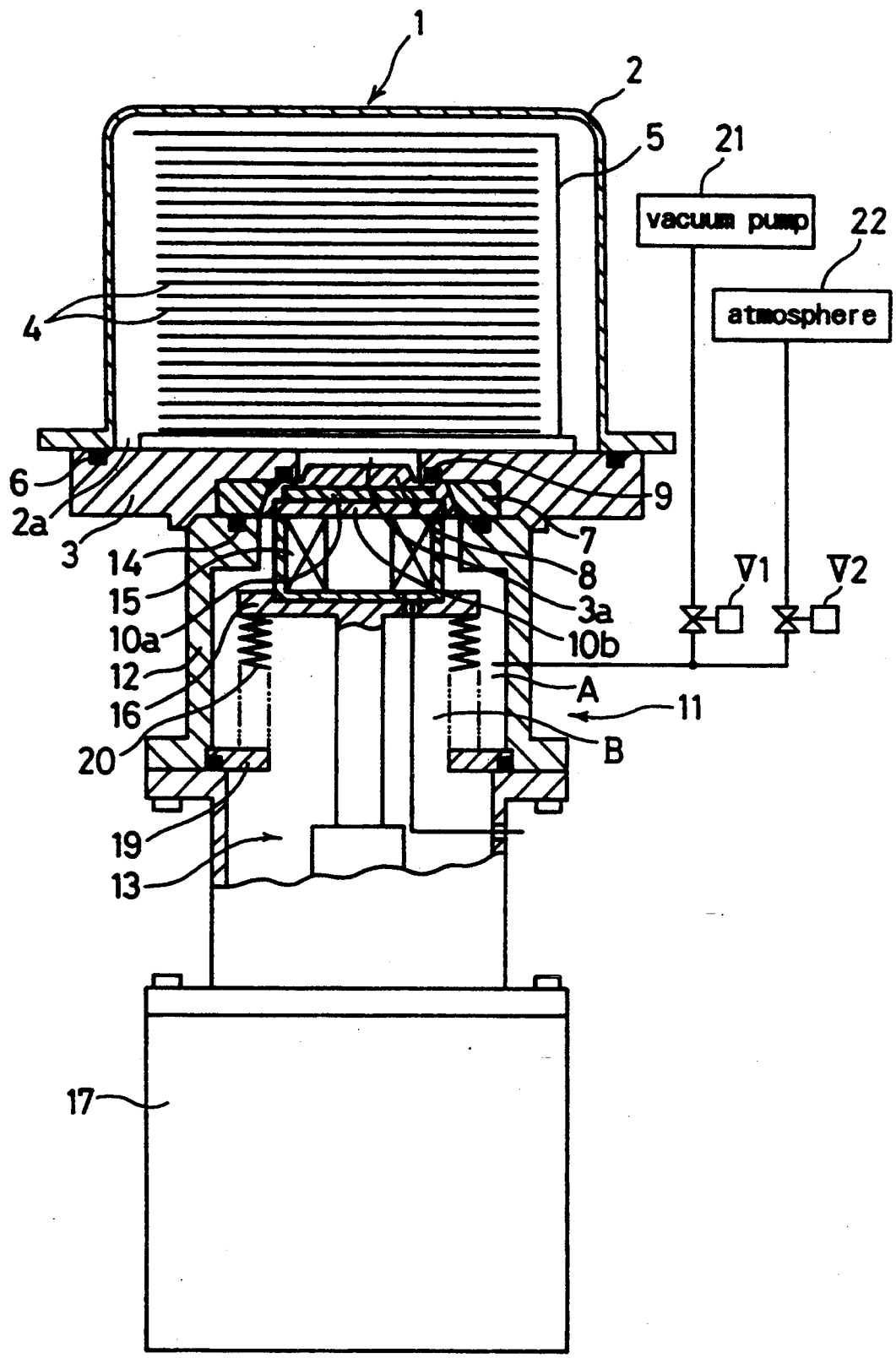
FIG. 2 is a cross-sectional view of the vacuum container and an evacuation and vacuum break station connected to each other according to an embodiment of the present invention.

A vacuum processing system according to the present invention will be described below with reference to the drawings. In this embodiment, wafers are used as substrates to be processed.

FIG. 1 shows a transportable vacuum container according to an embodiment of the present invention. A vacuum container 1 comprises a substantially bell jar shaped container body 2 having a main opening 2a at the lower end thereof, and a lid 3 for opening or closing the main opening 2a. Wafers 4 are placed in a wafer carrier 5 which is adapted to be placed on the lid 3. The wafers 4 together with the wafer carrier 5 are stored and transported after they are placed in the vacuum container 1. A vacuum seal 6 comprising an O-ring is interposed between the container body 2 and the lid 3. The lid 3 has a second opening 3a for evacuation or vacuum break at the central portion thereof.

In this specification, "evacuation" is defined as "lowering the pressure of the interior of the vacuum container below atmospheric pressure", and "vacuum break" is defined as "raising the pressure of the interior of the vacuum container to ambient". A ring 7 made of ferromagnetic material is fixed to the lid 3 in the vicinity of the second opening 3a. A plate 8 for opening or closing the second opening 3a includes a permanent magnet 10a, and a plate 10b made of ferromagnetic material which is provided under the permanent magnet 10a. A vacuum seal 9 comprising an O-ring is interposed between the lid 3 and the plate 8.

The plate 8 closes the second opening 3a with the vacuum seal 9 by differential pressure, and keeps the interior of the vacuum container 1 in vacuum. When the plate 8 is opened, the interior of the vacuum container 1 can be evacuated and the pressure of the interior of the vacuum container 1 can be raised to ambient. The second opening 3a and the plate 8 jointly constitute a vacuum sealable gate.

FIG. 2 shows the vacuum container 1 and an evacuation and vacuum break station 11 connected to each other. The evacuation and vacuum break station 11 comprises a housing 12 connectable to the lid 3 of the vacuum container 1, and an elevator 13 having a stage 16 which is capable of moving up and down in the housing 12. A vacuum seal 14 comprising an O-ring is interposed between the housing 12 and the lid 3 of the vacuum container 1. The elevator 13 includes the stage 16 having an electromagnet 15 at the upper portion thereof and an air cylinder 17 for moving the stage 16 vertically. After raising the stage 16, the plate 8 is held by magnetic force of the electromagnet 15 and engaged with or disengaged from the lid 3, whereby the second opening 3a of the lid 3 is opened or closed.

Between the stage 16 and a plate 19 fixed to the housing 12, there is provided a bellows 20 which partitions a space into two spaces A and B. The space A can be evacuated because it is separated from the space B which is at ambient. The space A is communicated with a vacuum pump 21 through a valve V1 and with the atmosphere 22 through a valve V2.

Next, an operation of the evacuation and vacuum break station 11 will be described with reference to FIGS. 3 and 4.

Figure 3:
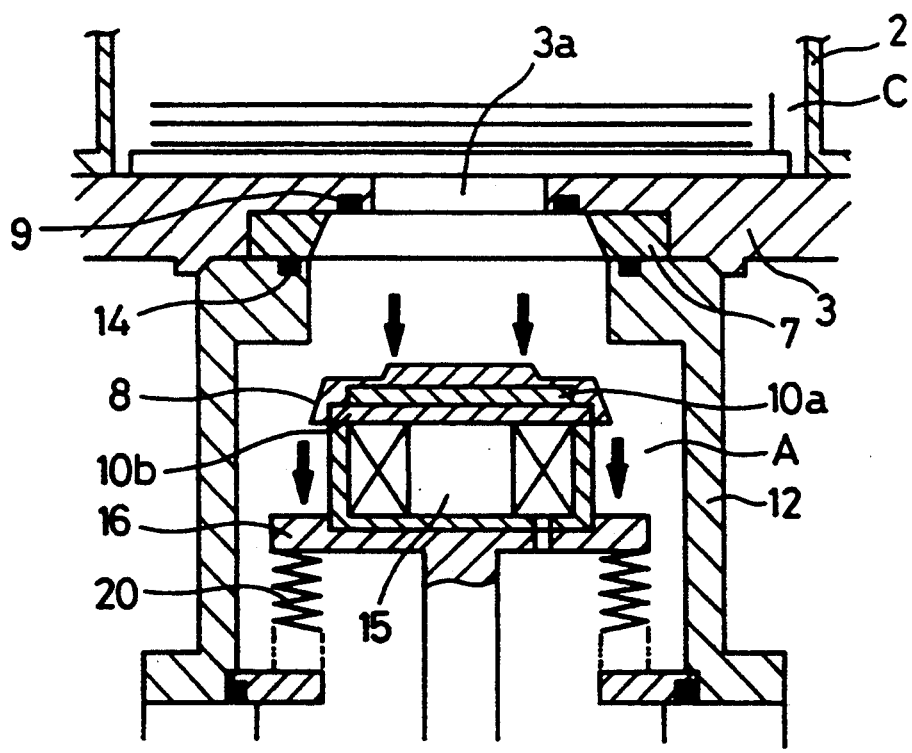
FIG. 3 is an explanatory view showing an operation of the vacuum container and the evacuation and vacuum break station.

FIG. 3 shows an opening operation of the second opening 3a by disengaging the plate 8 from the lid 3. At this time, the space C of the inside of the vacuum container 1 and the space A are of the same pressure (both spaces A and C are of atmospheric pressure or in vacuum). In case of disengaging the plate 8 from the lid 3, the air cylinder 17 raises the stage 16, thereby the electromagnet 15 approaches the plate 10b of the plate 8. The magnetic field of the permanent magnet 10a incorporated in the plate 8 affects the core of the electromagnet 15 through the plate 10b made of ferromagnetic material, whereby the plate 8 is held on the electromagnet 15 with the magnetic force between the permanent magnet 10a and the electromagnet 15. Then the stage 16 is lowered upon actuation of the air cylinder 17, thus the plate 8 is disengaged from the lid 3 and opens the second opening 3a. The valve V1 is opened, the space C inside the vacuum container 1 can be evacuated through the space A. While the space C is held in vacuum, the valve V2 is opened (at this time the valve V1 is closed), the pressure of the space C inside the vacuum container 1 is raised to ambient through the space A.

Figure 4:
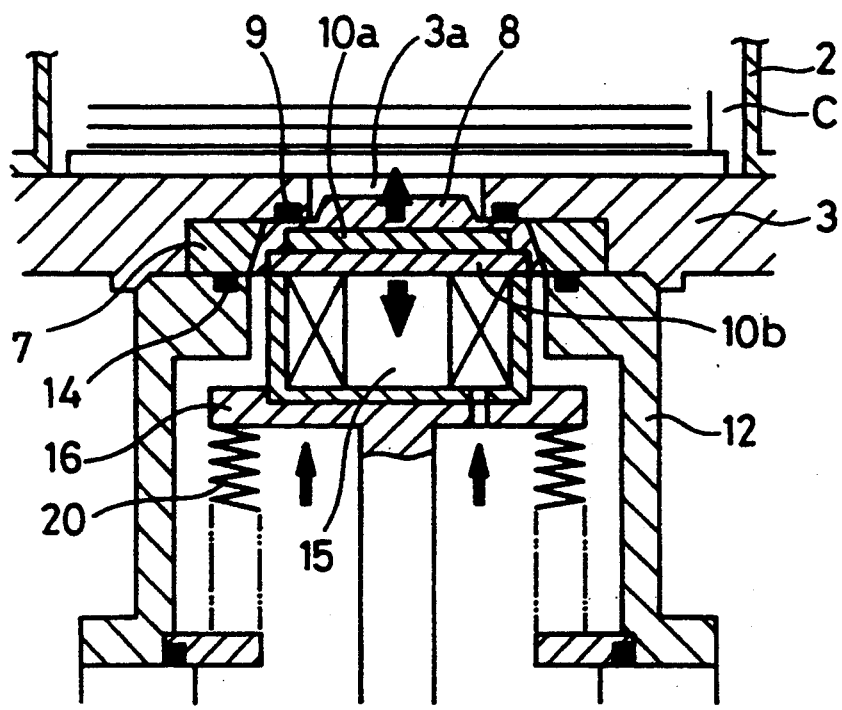
FIG. 4 is an explanatory view showing an operation of the vacuum container and the evacuation and vacuum break station.

FIG. 4 shows a closing operation of the second opening 3a by engaging the plate 8 with the lid 3. After the interior of the vacuum container 1 become in vacuum, the plate 8 held on the stage 16, is engaged with the lid 3 to close the second opening 3a.

Thereafter, the electric current to the electromagnet 15 is turned so as to generate the repulsion force against the permanent magnet 10a, thereby disengaging the plate 8 from the stage 16, and then the stage 16 is lowered.

The magnetic field of the permanent magnet 10a affects the ring 7 made of ferromagnetic material through the plate 10b made of ferromagnetic material, whereby the plate 8 attaches to the lid 3 due to the magnetic force of the permanent magnet 10a. Therefore, the interior of the vacuum container 1 is held in vacuum through the vacuum seal 9 interposed between the lid 3 and the plate 8. Since the vacuum seal 9 is pressed by the plate 8 because of the magnetic force of the permanent magnet 10a, even if the pressure of the space A adjacent to the space C is raised to ambient, the space C is held in vacuum. Further, even if leakage occurs into the vacuum container 1, the plate 8 is held by the lid 3 due to the magnetic force of the permanent magnet 10a, the plate 8 is thus prevented from dropping out of the lid 3. Since the opening or the closing of the second opening 3a is performed only by moving the stage 16 vertically and supplying electric current to the electromagnet 15, the second opening 3a can be easily opened or closed instantaneously.

By the above operation, after closing the second opening 3a of the lid 3, the valve V2 is opened (at this time the valve V1 is closed), and the pressure of the space A is raised to ambient. Thereafter, the vacuum container 1 is separated from the evacuation and vacuum station 11, and becomes transportable.

Figure 5:
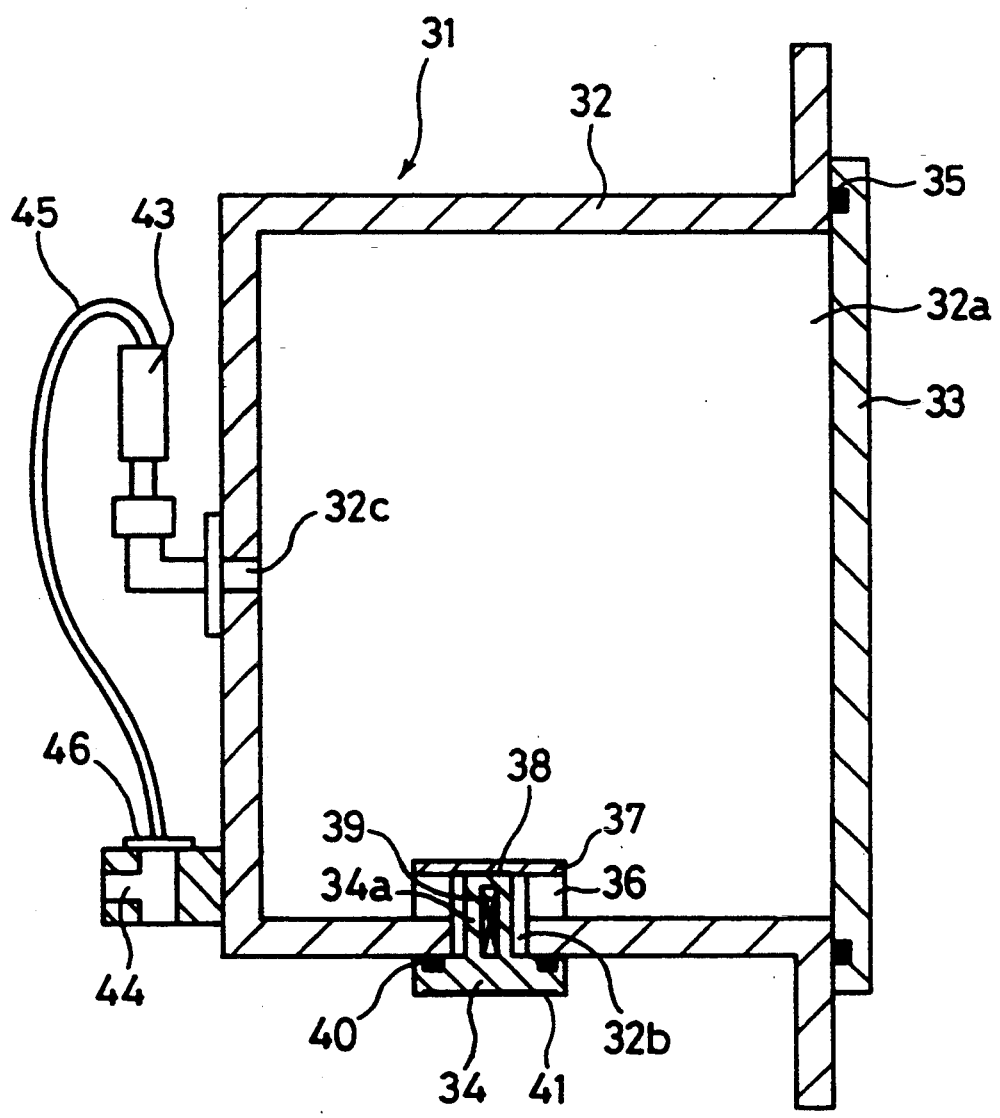
FIG. 5 is a cross-sectional view of a vacuum container according to a second embodiment of the present invention.

FIG. 5 shows another transportable vacuum container according to the second embodiment of the present invention. In this embodiment, a transportable vacuum container 31 comprises a container body 32 having a main opening 32a at one end thereof, and a lid 33 for opening or closing the main opening 2a. The container body 32 has a second opening 32b for evacuation and vacuum break at the side wall thereof. A plate 34 is provided to open or close the second opening 32b. A vacuum seal 35 comprising an O-ring is interposed between the container body 32 and the lid 33. A stationary plate 37 is fixed to the container body 32 through a supporting plate 36 in the vicinity of the second opening 32b. A thin ferromagnetic plate 38 is attached to the central portion of the stationary plate 37.

The plate 34 for opening or closing the second opening 32b has a projection 34a in which a permanent magnet 39 is provided. A vacuum seal 40 comprising an O-ring is interposed between the container body 32 and the plate 34. The plate 34 has a thin ferromagnetic plate 41 attached thereto at the back side of the projection 34a. The plate 34 closes the second opening 32b through the vacuum seal 40 by differential pressure while the interior of the vacuum container 31 is held in vacuum.

Since the magnetic field of the permanent magnet 39 affects the ferromagnetic plate 38 on the stationary plate 37, the plate 34 attaches to the stationary plate 37 due to the magnetic force of the permanent magnet 39. However, the magnetic force between the permanent magnet 39 and the stationary plate 37 is an auxiliary holding means which is not necessarily provided.

A passage 32c is formed on the top wall of the container body 32. A vacuum gage 43 is attached to the passage 32c to measure the pressure of the interior of the vacuum container 31. A connector 44 having a terminal is fixed to the container body 32 at a position slightly away from the passage 32c. A plug 46 provided on an end of a cable 45 of the vacuum gage 43 is inserted into the connector 44.

Figure 6:
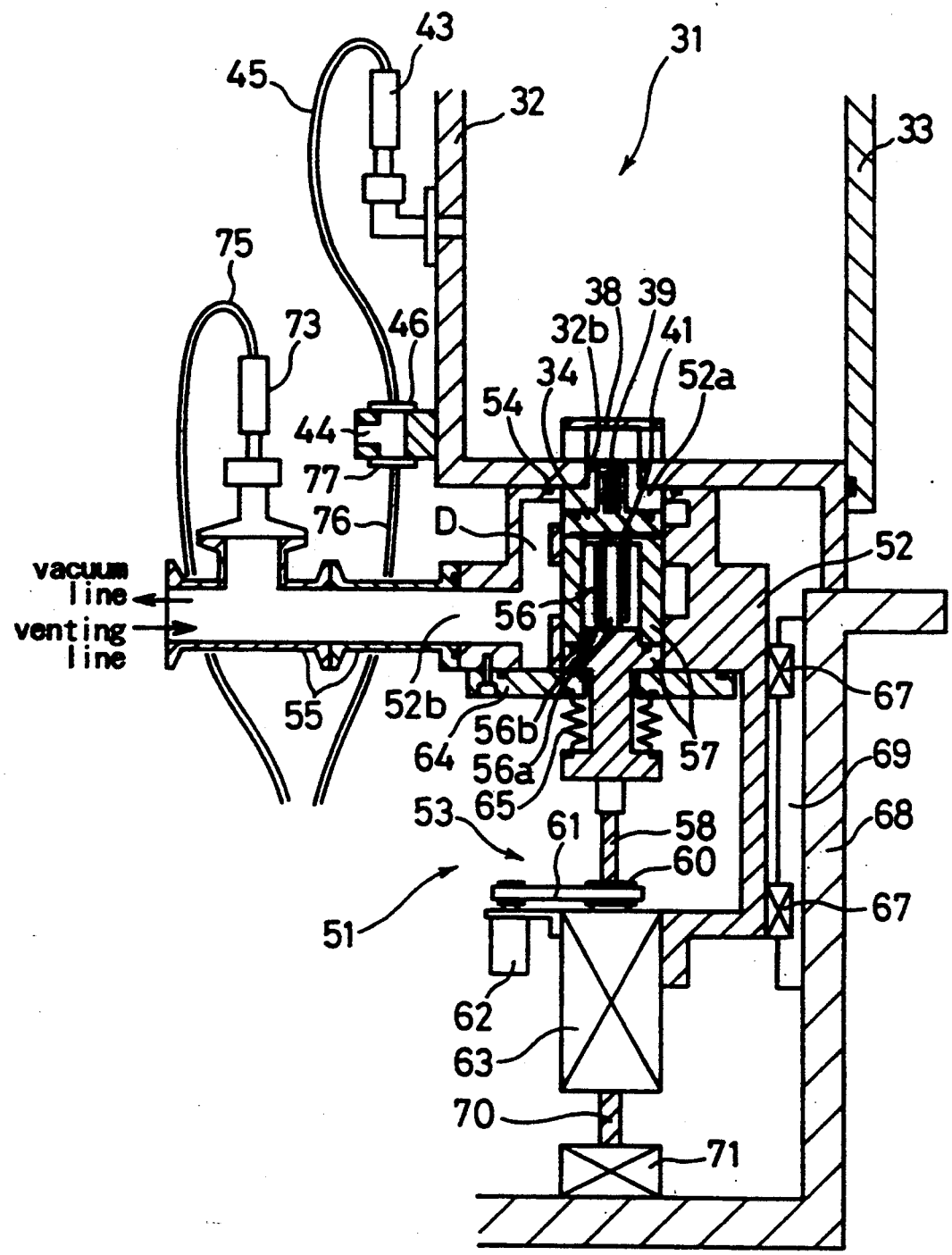
FIG. 6 is a cross-sectional view of the vacuum container and an evacuation and vacuum break station connected to each other according to the second embodiment of the present invention.

FIG. 6 shows the vacuum container 31 and an evacuation and vacuum break station 51 connected to each other. After the vacuum container 31 is connected to the evacuation and the vacuum break station 51, the plate 34 is then disengaged from the vacuum container 31 to open the opening 32b, and the interior of the vacuum container 31 is evacuated and held in vacuum.

Next, the evacuation and the vacuum break station 51 will be described below in detail.

The evacuation and vacuum break station 51 comprises a housing 52 connectable to the container body 32 of the vacuum container 31, and an elevator 53 having a stage 57 which is capable of moving up and down in the housing 52. A vacuum seal 54 comprising an O-ring is interposed between the housing 52 and the container body 32. The housing 52 has a space D therein, an upper opening 52a communicated with the space D and having a diameter slightly larger than that of the plate 34, and a side opening 52b communicated with the space D and a pipe 55. The pipe 55 is communicated with a vacuum line and a venting line.

The elevator 53 includes the stage 57 having an electromagnet 56 comprising permanent magnet 56a and a coil 56b provided around the permanent magnet 56a, a screw shaft 58 for moving the stage 57 vertically, and a pulley 60 threadingly engaged with the screw shaft 58. The pulley 60 is coupled to a motor 62 through a belt 61 and rotatably supported by a bearing 63. When the pulley 60 is rotated by the motor 62 in a clockwise or counterclockwise direction, the screw shaft 58 is moved vertically, thus the stage 57 is raised or lowered.

Between the stage 57 and a plate 64 fixed to the housing 52, there is provided a bellows 65 which defines a space D which is held in gas-tight sealing. Guide bearings 67 are fixed to the side wall of the housing 52. A guide rail 69 is fixed to a stationary bed 68. The guide bearings 67 are slidably mounted on the guide rail 69, and hence the housing 52 is vertically movably supported by the stationary bed 68.

The bearing 63 has a lower end which is coupled to a housing elevator 71 through a screw shaft 70. The housing elevator 71 is provided with a pulley, a motor or the like, the screw shaft 70 is moved up and down by the motor, thus the housing 52 is raised or lowered.

A vacuum gage 73 is attached to the pipe 55 to measure the pressure of the inside of the pipe 55. A cable 75 of the vacuum gage 73 is connected to a gage amplifier (not shown). A plug 77 of a cable 76 is plugged in the connector 44 to connect the cable 76 with the cable 45 electrically. Another end of the cable 76 is connected to a gage amplifier (not shown).

The pipe 55 is connected to a vacuum line and a venting line having a vacuum valve and a leak valve, respectively. When the leak valve is closed and the vacuum valve is opened, the interior of the pipe 55 is evacuated and held in vacuum. When the vacuum valve is closed and the leak valve is opened, the pressure in the pipe 55 is raised to ambient.

An operation of the evacuation and vacuum break station 51 will be described below with reference to FIG. 6.

The vacuum container 31 is transported and placed on the stationary bed 68, and is fixed to the stationary bed 68 by a fixing means (not shown). When a sensor (not shown) detects that the vacuum container 31 is placed on the stationary bed 68, the housing elevator 71 raises the housing 52 so that the housing 52 contacts the vacuum container 31.

The magnetic force of the permanent magnet 56a is canceled by exciting the coil 56b, and the motor 62 is then driven to raise the stage 57 through the screw shaft 58 so that the upper surface of the stage 57 contacts the plate 34 which closes the second opening 32b of the container body 32. As the magnetic force of the permanent magnet 56a is canceled by excitation of the coil 56b, even if the electromagnet 56 approaches the ferromagnetic plate 41 of the plate 34, the generated dust will be decreased because there is no clash of the magnets at the time of contact. Thereafter, the plate 34 is held by the magnetic force of the permanent magnet 56a with cutting off the current of the coil 56b.

After the leak valve is closed and the vacuum valve is opened, both the interior of the pipe 55 and the space D are evacuated. When the pressure in the pipe 55, detected by the vacuum gage 73, is equal to or less than the pressure in the vacuum container 31, detected by the vacuum gage 43, the stage 57 is lowered by driving the motor 62 in a reverse direction. At his time, the pressure in the vacuum container 31 is almost equal to the pressure in the pipe 55, thus the plate 34 is disengageable from the container body 32. Therefore, the plate 34 together with the stage 57 is lowered by the elevator 53 in such a state that the plate 34 is held by the electromagnet 56 due to the magnetic force of the permanent magnet 56a.

Thus, the interior of the vacuum container 31 is communicated with the vacuum line through the pipe 55. As a result, the interior of the vacuum container 31 is evacuated and held in vacuum. When the vacuum container 31 is connected to the evacuation and the vacuum station 51, the interior of the vacuum container 31 is continuously or intermittently evacuated to keep the pressure thereof at a certain value.

When the vacuum container 31 is to be separated from the evacuation and the vacuum break station 51, the stage 57 is raised by driving the motor 62 and the plate 34 is engaged with the container body 32 to close the second opening 32b. At this time, the plate 34 attaches to the container body 32 due to the magnetic force between the permanent magnet 39 and the ferromagnetic plate 38.

Thereafter, the vacuum valve is closed and the leak valve is opened, the pressure in the pipe 55 and the space D is raised to ambient. Since the pressure in the space D is higher than that in the vacuum container 31, the plate 34 is held by the container body 32 by differential pressure. The stage 57 is then lowered by driving the motor 62, and the vacuum container 31 is separated from the evacuation and the vacuum break station 51 and becomes transportable.

It should be noted that there may be provided a plurality of the evacuation and vacuum break stations 51 to which the corresponding vacuum containers 31 can be connected, whereby a number of wafers can be stored for a long time.

Figure 7:
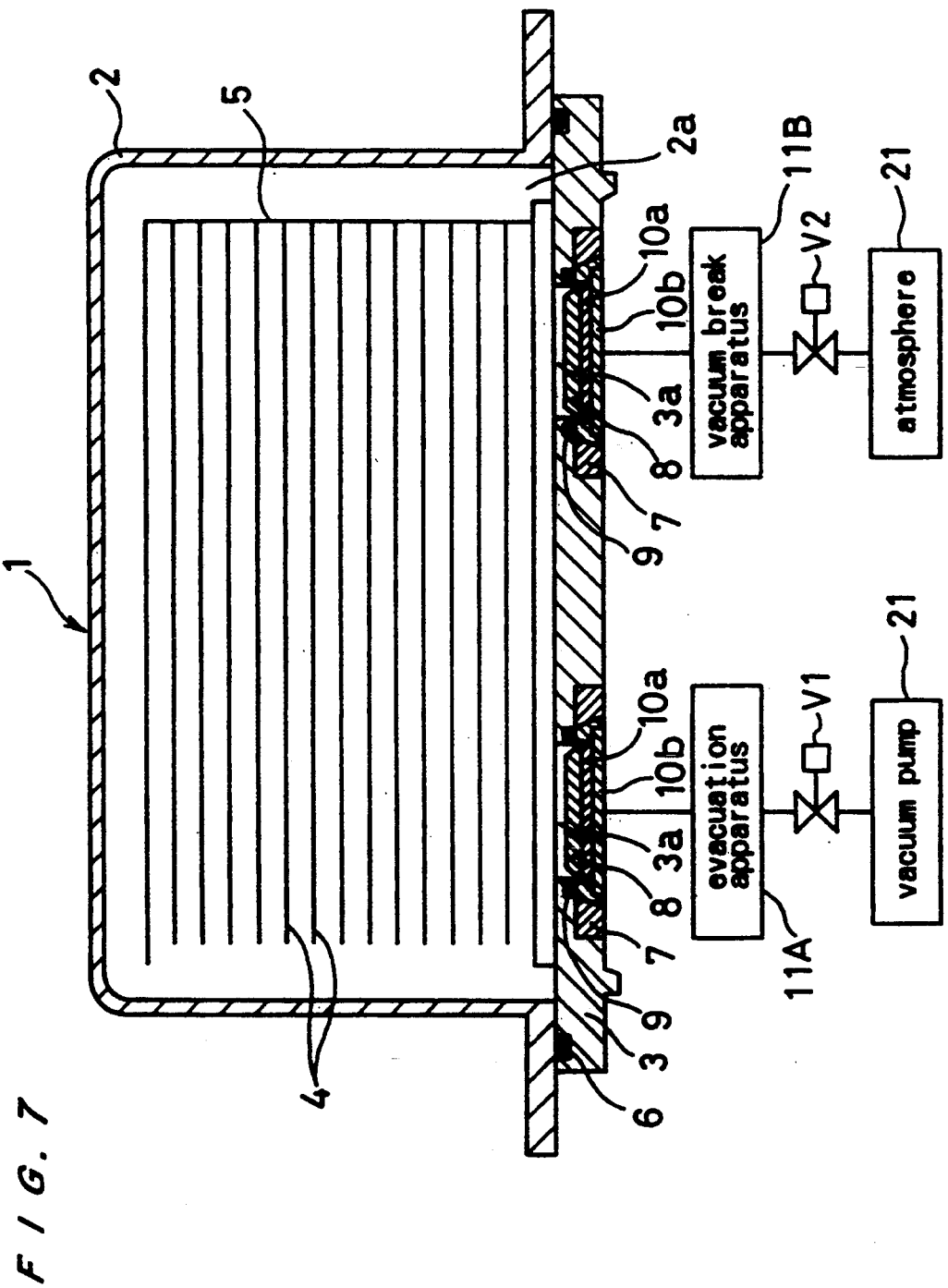
FIG. 7 is a cross-sectional view of the vacuum container according to the third embodiment of the present invention.

FIG. 7 shows a transportable vacuum container according to the third embodiment of the present invention. In this embodiment, another second opening 3a and a plate 8 for opening or closing the second opening 3a are added to the vacuum container 1 shown in FIG. 1. That is, the vacuum container 1 of this embodiment has two second-openings 3a, 3a and two plates 8 and 8. Each plate 8 comprises a permanent magnet 10a and a plate 10b, made of ferromagnetic material, and a ring 7, made of ferromagnetic material, is provided around the second opening 3a like the vacuum container of FIG. 1.

In this embodiment, one of the second-openings 3a is exclusively used for evacuation and connectable to an evacuation apparatus 11A, and the other opening 3a is exclusively used for vacuum break and connectable to a vacuum break apparatus 11B. The evacuation apparatus 11A is communicated with a vacuum pump 21 through a valve V1, the vacuum break apparatus 11B is communicated with the atmosphere 22 through a valve V2. The evacuation apparatus 11A and the vacuum break apparatus 11B can be the same structure as the evacuation and vacuum break apparatus 11 in FIG. 2.

In general, during evacuation, air-borne particles in the vacuum container 1 may be discharged from the vacuum container to the evacuation and vacuum break apparatus through the second opening. A part of the particles may adhere to the inner surface of the evacuation and vacuum break apparatus. If the vacuum container has a single second opening where both evacuation and vacuum break are performed, there is a possibility that the particles, adhering to the inner surface of the evacuation and vacuum break apparatus, are removed by air flow at the vent and enter the vacuum container again, and this results in contamination of the wafers.

However, in this embodiment, the vacuum container 1 has two second-openings 3a, 3a, one is exclusively used for evacuation and the other is exclusively used for vacuum break, thus reducing contamination of the wafers, because air-flow is always in one way.

Next, an embodiment of a vacuum processing apparatus using the vacuum container 1 and the evacuation and vacuum break station 11 shown in FIGS. 1 and 2 will be described below. In this embodiment, the wafers, contained in the vacuum container 1, are transferred to a vacuum process chamber under vacuum.

Figure 8:
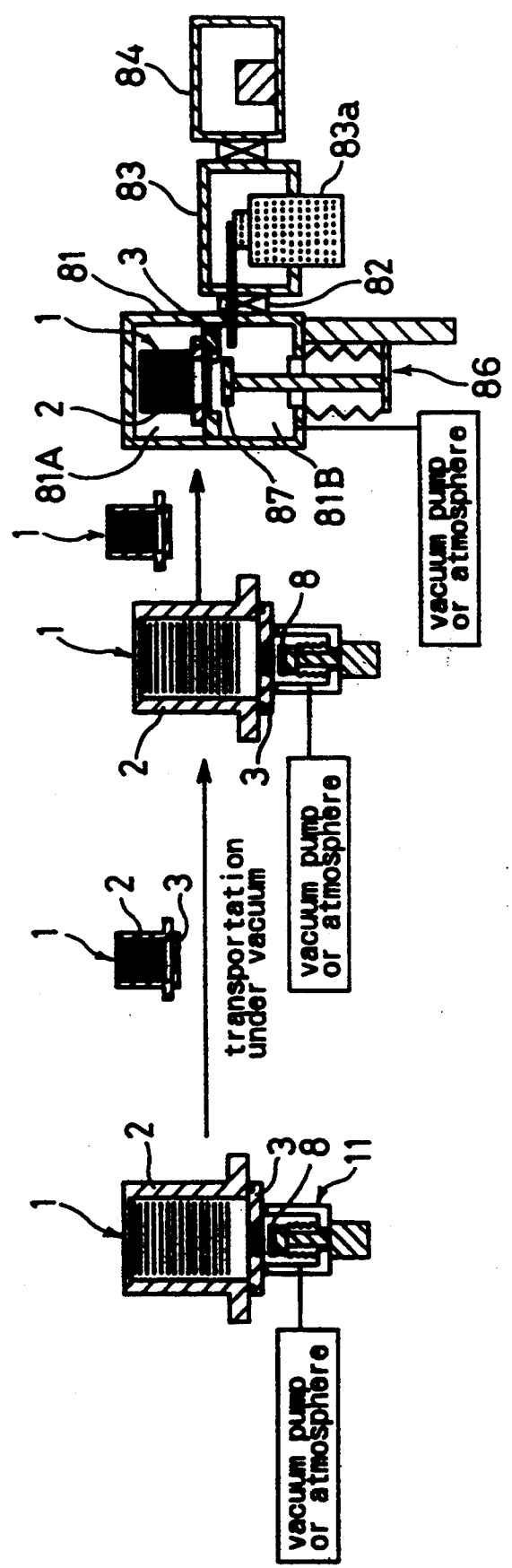
FIG. 8 is a schematic view of a vacuum processing apparatus according to an embodiment of the present invention.

As shown in FIG. 8, the vacuum processing apparatus includes the vacuum container 1 for storing and transporting the wafers, the evacuation and vacuum break stations 11 for evacuation or vacuum break of the interior of the vacuum container 1, and a load lock 81 which is connectable to the vacuum container 1. The vacuum processing apparatus further includes a robot chamber 83 which is connected to the load lock 81 through a gate valve 82, and has a robot 83a therein, and a vacuum process chamber 84 where a vacuum process is applied to the wafers. In the load lock 81, there is provided a stage 87 which is moved up and down by an elevator 86. The load lock 81 is partitioned into an upper load lock 81A and a lower load lock 81B.

Next, a vacuum processing method using the above vacuum processing apparatus will be described below with reference to FIG. 8.

The lid 3, having the second opening 3a closed by the plate 8, is placed on the evacuation and vacuum break station 51 at ambient pressure. The wafer carrier 5, containing the wafers, is placed on the lid 3, and the container body 2 is placed on the lid 3. The interior of the vacuum container 1 is evacuated according to the method described in conjunction with FIG. 3, and the wafers in the vacuum container 1 are stored under vacuum.

Thereafter, the vacuum container 1 is separated from the evacuation and the vacuum break station 11 according to the method described in conjunction with FIG. 4, and becomes transportable. The vacuum container 1 is then transported to a process station, and connected to another evacuation and the vacuum break station 11 installed adjacent to the process station. The interior of the vacuum container 1 is then evacuated and held in vacuum. The wafers are stored in vacuum without pressure rise until the process station is ready to carry out process steps for the wafers after finishing process steps for preceding wafers. The vacuum container 1 is then connected to the upper load lock 81A, and the wafer carrier 5 together with the lid 3 is lowered into the lower load lock 81B by lowering the stage 87 while the container body 2 remains in the upper load lock 81A. Thereafter, the wafers are transferred from the wafer carrier 5 to the vacuum process chamber 84 by the robot 83a.

According to the vacuum processing method shown in FIG. 8, the wafers can be transferred from the vacuum container 1 to the vacuum process chamber 84 under vacuum and a predetermined vacuum process step can be applied to the wafers. The wafers are transferred back to the vacuum container 1 under vacuum after the vacuum process step has been carried out in the vacuum process chamber 84. The vacuum container 1 is then transported to a next process station, and the wafers are transferred to a next process chamber under vacuum in the same manner described above.

Next, another embodiment of the vacuum processing apparatus using the vacuum container 1 and the evacuation and vacuum break station 11 will be described below with reference to FIG. 9. In this embodiment, a vacuum container 1 containing the wafers is transported to a place adjacent to a vacuum process station under vacuum, the wafers are stored under vacuum without pressure rising. The wafers are stored in vacuum without pressure rise until the process station is ready to carry out process steps for the wafers after finishing process steps for preceding wafers. Before the wafers are transferred to the process station, the interior of the vacuum container 1 is raised to ambient, and the wafers in the wafer carrier 5 are taken out of the vacuum container 1 into ambient and placed in the load lock of the process station.

As shown in FIG. 9, the vacuum processing apparatus includes the vacuum container 1 for storing and transporting the wafers, the evacuation and vacuum break stations 11 for evacuation or vacuum break of the interior of the vacuum container 1, and a load lock 91 which is connectable to the vacuum container 1. The vacuum processing apparatus further includes a robot chamber 93 which is connected to the load lock 91 through a gate valve 92 and has a robot 93a therein, and a vacuum process chamber 94 in which a vacuum process step is applied to the wafers. In the load lock 91, there is provided a stage 97 which is moved up and down by an elevator 96.

Next, a vacuum processing method using the above vacuum processing apparatus will be described below with reference to FIG. 9.

The vacuum container 1 is transferred to the process station, the wafers are stored in the vacuum container 1 under vacuum using the evacuation and the vacuum break station 11, and wait for next process steps in the same manner as FIG. 8. Next, the pressure in the vacuum container 1 is raised to ambient by the method described in FIG. 4 using the evacuation and vacuum break station 11, and then the wafers in the wafer carrier 5 are taken out of the vacuum container 1 at ambient. Thereafter, the wafers in the wafer carrier 5 are placed in the load lock 91 of the process station at ambient, and then the interior of the load lock 91 is evacuated. The gate valve 92 is opened and the wafers are transferred to the vacuum process chamber 94 by the robot 93a in the robot chamber 93 under vacuum. The wafers are transferred back to the vacuum container 1 after vacuum process steps have been carried out. The wafers are then transported to a next process station, and stored in the vacuum container 1 under vacuum using the evacuation and the vacuum break station 11.

According to the vacuum container of the present invention, the interior of the vacuum container can be evacuated using the gate provided on the vacuum container. Therefore, the substrates are prevented from deterioration such as oxidation, because the pressure in the vacuum container, where wafers are stored, is held in vacuum without pressure rise.

According to one aspect of the vacuum processing apparatus and method of the present invention, the substrates are stored in the vacuum container under vacuum without pressure rise as the interior of the vacuum container is evacuated. After transporting the vacuum container to the vacuum process station, the substrates can be transferred to the load lock of the vacuum process station under vacuum.

According to another aspect of the vacuum processing apparatus and method of the present invention, the substrates are stored in the vacuum container under vacuum without pressure rise as the interior of the vacuum container is evacuated. After the interior of the vacuum container is raised to ambient, the substrates are taken out of the vacuum container into ambient, and transferred to the load lock of the vacuum process station at ambient.

What is claimed is:

1. A transportable vacuum container comprising:
    a container body having an interior for containing substrates and a main opening for inserting substrates to said interior and for taking out the substrates therefrom;
    a lid transportable with said container body engageable with said container body for closing and sealing said main opening of said container body; and
    a gate including a second opening and a removable plate for closing said second opening provided on one of said container body and said lid for communicating said container body interior upon removal of said closure plate with a source of vacuum pressure or atmospheric pressure for performing at least one of evacuating an interior of the vacuum container and raising the pressure of the interior of the vacuum container to ambient.

2. The transportable vacuum container according to claim 1, wherein said lid is held closed by differential pressure between the pressure of the interior of the vacuum container and the surrounding atmospheric pressure.

3. The transportable vacuum container according to claim 1, wherein said gate operates to alternatively evacuate the interior of the vacuum container and raise the pressure of the interior of the vacuum container to ambient.

4. The transportable vacuum container according to claim 1, wherein said gate is exclusively used for evacuating the interior of the vacuum container.

5. The transportable vacuum container according to claim 1, wherein said gate is exclusively used for raising the pressure of the interior of the vacuum container to ambient.

6. The transportable vacuum container according to claim 1, wherein said plate is held closed by differential pressure between the pressure of the interior of the vacuum container and the surrounding atmospheric pressure.

7. The transportable vacuum container according to claim 6, wherein plate includes a permanent magnet, and one of said lid and said container body includes a ring made of ferromagnetic material disposed around said second opening for receiving said plate.

8. A vacuum processing method comprising the steps of:
    placing a plurality of substrates in a transportable vacuum container, said vacuum container having a vacuum sealable lid and a vacuum sealable gate including an opening and a removable closure plate;
    storing said substrates in said vacuum container under vacuum while evacuating an interior of said vacuum container through said gate by removal of said closure plate from said opening;
    returning said closure plate to said opening for maintaining said vacuum within said container body;
    transporting said substrates in said vacuum container to a vacuum process station under vacuum after closing said gate; and
    connecting said vacuum container to a load lock of said vacuum process station and transferring said substrates from said vacuum container to said load lock under vacuum after opening said lid of said vacuum container.

9. A vacuum processing method comprising the steps of:
    placing a plurality of substrates in a transportable vacuum container, said vacuum container having a vacuum sealable lid and a vacuum sealable gate including an opening and a removable closure plate;
    storing said substrates in said vacuum container under vacuum while evacuating an interior of said vacuum container through said gate by removal of said closure plate from said opening;
    raising the pressure of the interior of said vacuum container to ambient while said closure plate is removed; and
    transferring said substrates into a load lock of a vacuum process station at ambient after taking out said substrates from said vacuum container.

10. A vacuum processing apparatus comprising:
    a vacuum container for containing a plurality of substrates, said container having a vacuum sealable lid and a vacuum sealable gate;
    an evacuation and vacuum break station for selectively evacuating an interior of said vacuum container and raising the pressure of the interior of said vacuum container to ambient through said gate;
    a load lock communicating with a vacuum processing chamber;
    means connecting said load lock to said vacuum container;
    means for transferring said substrates from said vacuum container into said load lock under vacuum; and means for transferring said substrates from said load lock to said vacuum process chamber.

11. The vacuum processing apparatus according to claim 10, wherein said gate comprises a second opening and a plate for closing and sealing said second opening, said evacuation and vacuum break station having a movable stage connected to an elevator and having a holding means for holding said plate to remove said plate from said second opening as said stage is moved.

12. A vacuum processing apparatus comprising:
    a vacuum container for containing a plurality of substrates, said container having a vacuum sealable lid and a vacuum sealable gate;
    an evacuation and vacuum break station for selectively evacuating an interior of said vacuum container and raising the pressure of the interior of said vacuum container to ambient through said gate;

a load lock communicating with a vacuum processing chamber;

means connecting said load lock to said vacuum container, means for transferring said substrates from said vacuum container into said load lock at ambient after raising the pressure of the interior of said vacuum container to ambient; and means for transferring said substrates from said load lock to said vacuum processing chamber.

13. The vacuum processing apparatus according to claim 12, wherein said gate comprises a second opening and a plate for closing and sealing said second opening, said evacuation and vacuum break station having a movable stage connected to an elevator and having a holding means for holding said plate to remove said plate from said second opening as said stage is moved.

* * * * *